(12) United States Patent
Sinha et al.

(10) Patent No.: US 11,075,638 B1
(45) Date of Patent: Jul. 27, 2021

(54) SYSTEM AND METHOD FOR CALIBRATING DIGITAL PHASE LOCKED LOOP

(71) Applicant: NXP USA, Inc., Austin, TX (US)

(72) Inventors: Anand Kumar Sinha, Noida (IN); Krishna Thakur, GautamBudh Nagar (IN); Pawan Sabharwal, Ghaziabad (IN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/247,861

(22) Filed: Dec. 28, 2020

(51) Int. Cl.
*H03L 7/099* (2006.01)
*H03L 7/10* (2006.01)
*H03L 7/091* (2006.01)

(52) U.S. Cl.
CPC .......... *H03L 7/0992* (2013.01); *H03L 7/091* (2013.01); *H03L 7/103* (2013.01); *H03L 2207/06* (2013.01)

(58) Field of Classification Search
CPC ....... H03L 7/0992; H03L 7/091; H03L 7/103; H03L 2207/06; H03L 7/08; H03L 7/093; H03L 7/0995; H03L 7/099; H03L 7/085; H03L 7/18; H03L 7/087; H03L 7/0891; H03L 7/0991; H03L 7/10

USPC ......................................... 327/147, 156, 158
See application file for complete search history.

(56) References Cited

U.S. PATENT DOCUMENTS

| | | | |
|---|---|---|---|
| 6,150,887 A | 11/2000 | Yamaguchi | |
| 6,570,947 B1 | 5/2003 | Zipper et al. | |
| 7,466,207 B2 | 12/2008 | Staszewski et al. | |
| 9,252,791 B1* | 2/2016 | Sinha | H03L 7/099 |
| 9,793,906 B1 | 10/2017 | Midha | |
| 10,158,367 B1* | 12/2018 | Yu | H03L 7/235 |
| 2011/0057696 A1 | 3/2011 | Hsieh et al. | |
| 2012/0176169 A1 | 7/2012 | Sinha et al. | |
| 2019/0214999 A1* | 7/2019 | Yu | G04F 10/005 |

* cited by examiner

*Primary Examiner* — John W Poos
(74) *Attorney, Agent, or Firm* — Rajeev Madnawat

(57) ABSTRACT

A calibration system of a digital phase locked loop (DPLL) includes a calibration circuit and a digitally controlled oscillator (DCO). The calibration circuit is configured to receive an input signal and a feedback signal, and generate a digital signal, based on a frequency of the input signal, a frequency of the feedback signal, and an input bias code. The DCO is configured to receive the input bias code and the digital signal, and generate a bias signal based on the input bias code. The DCO is further configured to generate an analog signal based on the bias signal and the digital signal, and generate the feedback signal such that the frequency of the feedback signal is based on an amplitude of the analog signal.

20 Claims, 4 Drawing Sheets

SYSTEM AND METHOD FOR CALIBRATING DIGITAL PHASE LOCKED LOOP

BACKGROUND

The present disclosure relates generally to electronic circuits and, more particularly, to a system and method for calibrating a digital phase locked loop (DPLL).

A DPLL receives an input signal and generates an output signal such that a phase of the output signal is matched to the phase of the input signal. The DPLL utilizes the output signal as a feedback signal to compare the phases of the input and output signals and controls the generation of the output signal such that the phases of the input and output signals are matched.

A conventional DPLL includes a digitally controlled oscillator (DCO) that generates an output signal based on an input signal and an N-bit digital signal. The N-bits of the N-bit digital signal are determined based on the comparison between the input and output signals. A dynamic range, i.e., a desired frequency range of operation of the DPLL, is determined based on the N-bit digital signal such that a number of bits in the N-bit digital signal is directly proportional to the dynamic range. The minimum and maximum frequencies at which the DPLL operates are determined based on the N-bit digital signal. Thus, when the desired frequency range of the DPLL is high, a number of bits required in the N-bit digital signal increases for a fixed unit current bit. Hence, a size of the DCO increases. Further, when the dynamic range of the DPLL is low, frequency variations due to variations in process, voltage, and temperature (PVT) and frequency modulation techniques associated with the DPLL cause a failure of the DPLL to match the phases of the input and output signals. Additionally, the DCO receives a bias signal from a bias generator external to the DCO to perform a frequency calibration of the DPLL due to which the DPLL is unable to track the variations in PVT associated with the DPLL. Therefore, there exists a need for a DPLL that solves the aforementioned problems of the conventional DPLL.

SUMMARY

In one embodiment, a calibration system of a digital phase locked loop (DPLL) is disclosed. The calibration system includes a calibration circuit and a digitally controlled oscillator (DCO). The calibration circuit is configured to receive an input signal and a feedback signal, and generate a digital signal, based on a frequency of the input signal, a frequency of the feedback signal, and an input bias code. The DCO is coupled with the calibration circuit, and configured to receive the input bias code and the digital signal, and generate a bias signal based on the input bias code. The DCO is further configured to generate an analog signal based on the bias signal and the digital signal, and generate the feedback signal based on the analog signal. The frequency of the feedback signal is based on an amplitude of the analog signal.

In another embodiment, a DCO is disclosed. The DCO includes a bias generator, a digital-to-analog converter (DAC), and an oscillator circuit. The bias generator is configured to receive an input bias code, and generate a bias signal. The DAC is coupled with the bias generator, and configured to receive a digital signal and the bias signal. The DAC is further configured to convert the digital signal to generate an analog signal based on the bias signal. The oscillator circuit is coupled with the DAC, and configured to receive the analog signal and generate an output signal. A frequency of the output signal is based on an amplitude of the analog signal.

In yet another embodiment, a method of calibrating a DPLL is disclosed. The method includes receiving, by a calibration circuit of the DPLL, an input signal and a feedback signal, and generating, by the calibration circuit, a digital signal based on a frequency of the input signal, a frequency of the feedback signal, and an input bias code. The method further includes receiving, by a DCO of the DPLL, the input bias code and the digital signal, and generating, by the DCO, a bias signal based on the input bias code. The method further includes generating, by the DCO, an analog signal based on the bias signal and the digital signal and generating, by the DCO, the feedback signal based on the analog signal. The frequency of the feedback signal is based on an amplitude of the analog signal.

In some embodiments, the calibration circuit is further configured to generate an enable signal when the digital signal is within an acceptable range associated with the DPLL. The acceptable range is a frequency range within which the DPLL is configured to acquire a phase lock between the input signal and the feedback signal. Based on the enable signal, the DPLL is configured to acquire a phase lock between the input and feedback signals.

In some embodiments, the calibration circuit is further configured to generate the enable signal when the digital signal exceeds the acceptable range and the input bias code is equal to a predefined threshold.

In some embodiments, when the digital signal exceeds the acceptable range, the calibration circuit is further configured to generate the digital signal within the acceptable range based on the frequency of the input signal, the frequency of the feedback signal, and a first bias code of a plurality of bias codes as the input bias code. The digital signal exceeds the acceptable range when the input bias code is a second bias code of the plurality of bias codes.

In some embodiments, the acceptable range associated with the DPLL is based on a number of bits in the digital signal, a frequency modulation technique associated with the DPLL, and process, voltage, and temperature variations associated with the DPLL.

In some embodiments, the DCO includes a bias generator, a DAC, and an oscillator circuit. The bias generator is coupled with the calibration circuit, and configured to receive the input bias code and generate the bias signal. The DAC is coupled with the calibration circuit and the bias generator, and configured to receive the digital signal and the bias signal. The DAC is further configured to convert the digital signal to generate the analog signal based on the bias signal. The oscillator circuit is coupled with the DAC and the calibration circuit, and configured to receive the analog signal, generate the feedback signal, and provide the feedback signal to the calibration circuit.

In some embodiments, the bias generator includes a current mirror circuit, a resistor, a replica circuit, and an amplifier. The current mirror circuit is coupled with the calibration circuit, and configured to receive a supply voltage signal, the bias signal, and the input bias code, and generate first and second control signals. A first current associated with the first control signal is based on the input bias code. A second current associated with the second control signal is based on the first current and a current mirror ratio associated with the current mirror circuit. The resistor is coupled between the current mirror circuit and a ground terminal, and configured to receive the first control signal. A first voltage signal corresponds to a voltage drop across the resistor. The replica circuit is coupled between the current mirror circuit and the ground terminal, and configured to receive the second control signal and output a second voltage signal, such that the second voltage signal is directly proportional to the analog signal. The amplifier is coupled with the resistor and the replica circuit, and configured to receive the first and second voltage signals and generate the bias signal.

In some embodiments, the current mirror circuit further includes a first plurality of transistors, a bias control circuit, and a second transistor. The first plurality of transistors are coupled in parallel, and configured to receive the supply voltage signal and the bias signal, and generate the first control signal. The bias control circuit is coupled between the amplifier and the first plurality of transistors, and configured to receive the bias signal. The bias control circuit is further coupled with the calibration circuit, and configured to receive the input bias code and provide the bias signal to a first set of transistors of the first plurality of transistors, based on the input bias code. The second transistor is coupled with the amplifier, and configured to receive the supply voltage signal, the bias signal, and generate the second control signal.

In some embodiments, the first current associated with the first control signal is directly proportional to a number of transistors in the first set of transistors. The current mirror ratio is based on the number of transistors in the first set of transistors.

In some embodiments, the replica circuit further includes a third transistor and a fourth transistor. The third transistor has a source terminal that is coupled with the ground terminal, a gate terminal that is configured to receive the second control signal, and a drain terminal that is configured to generate and output the second voltage signal. The fourth transistor has a source terminal that is coupled with the drain terminal of the third transistor, and configured to receive the second voltage signal, a gate terminal that is coupled with the ground terminal, and a drain terminal that is coupled with the ground terminal.

Various embodiments of the present disclosure disclose a calibration system of a DPLL. The calibration system includes a calibration circuit and a DCO. The calibration circuit is configured to receive an input signal and a feedback signal. To calibrate the DPLL, the calibration circuit is further configured to generate a digital signal based on frequencies of the input and feedback signals and an input bias code. The DCO is configured to receive the input bias code and the digital signal, and generate a bias signal based on the input bias code. The DCO is further configured to generate an analog signal based on the bias signal and the digital signal, and generate the feedback signal such that the frequency of the feedback signal is based on an amplitude of the analog signal.

The feedback signal is thus generated based on the bias signal and the digital signal. As the bias signal is generated based on the input bias code, and the bias signal and the digital signal determine a dynamic range, i.e., a desired frequency range of operation, of the DPLL, the calibration circuit is capable of varying the dynamic range of the DPLL by varying the input bias code. Thus, when the desired frequency range of the DPLL is high, the calibration circuit increases the dynamic range of the DPLL by varing the input bias code. As a result, a need to increase a number of bits in the digital signal to increase the dynamic range of the DPLL is eliminated, thereby reducing a size of the DCO as compared to a DCO of a conventional calibration system of a conventional DPLL. Further, frequency variations due to variations in process, voltage, and temperature (PVT) and frequency modulation techniques associated with the DPLL do not affect an ability of the DPLL of the present disclosure to acquire a phase lock. Additionally, the DCO generates the bias signal internally due to which the DPLL is capable of tracking the variation in PVT associated with the DPLL.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
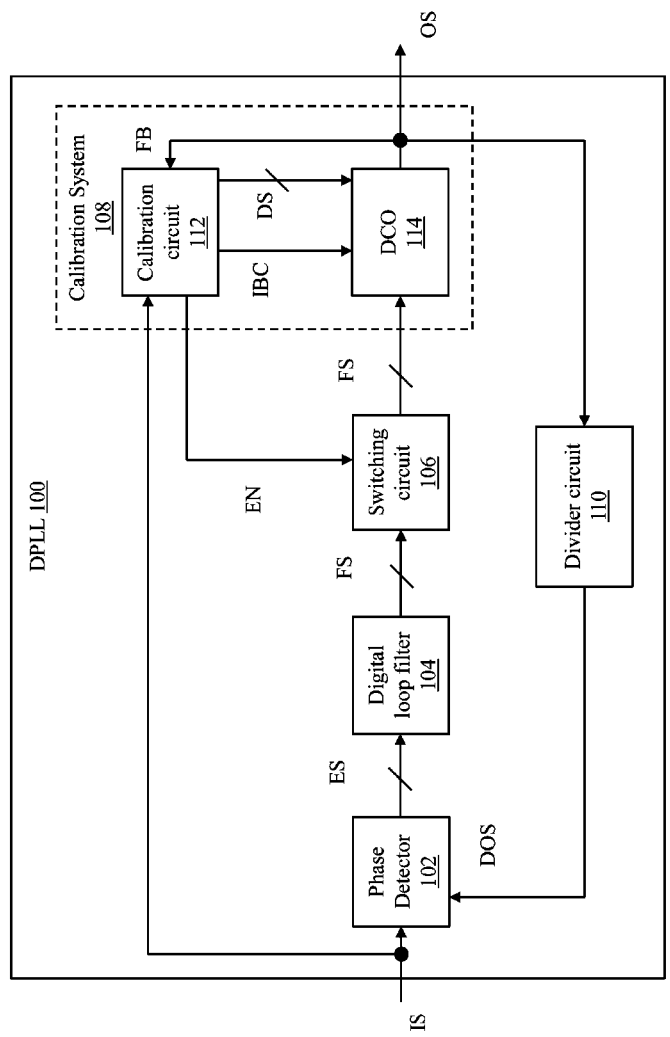
FIG. 1 is a schematic block diagram of a digital phase locked loop (DPLL) in accordance with an embodiment of the present disclosure.

FIG. 1 is a schematic block diagram of a digital phase locked loop (DPLL) 100 in accordance with an embodiment of the present disclosure. The DPLL 100 is configured to receive an input signal IS and generate an output signal OS such that a phase of the output signal OS is related to a phase of the input signal IS. In other words, the DPLL 100 is configured to acquire a phase lock between the input signal IS and the output signal OS such that the phases of the input signal IS and the output signal OS are matched. The DPLL 100 may be implemented in electronic and communication systems, for example, microprocessors, radio frequency transceivers, hard disk driving apparatuses, fiber optics transceivers, or the like. The DPLL 100 includes a phase detector 102, a digital loop filter 104, a switching circuit 106, a calibration system 108, and a divider circuit 110.

The phase detector 102 includes suitable logic circuitry that may be configured to perform one or more phase detection operations. The phase detector 102 is coupled with the digital loop filter 104 and the divider circuit 110, and configured to receive the input signal IS and a divider output signal DOS. Further, the phase detector 102 is configured to compare the input signal IS and the divider output signal DOS, and generate an error signal ES. In one embodiment, the phase detector 102 compares phases of the input signal IS and the divider output signal DOS to generate the error signal ES. The error signal ES thus indicates a difference between the phases of the input signal IS and the divider output signal DOS. In one example, the error signal ES is an N-bit digital signal. In one example, the phase detector 102 is a time-to-digital converter.

The digital loop filter 104 includes suitable circuitry that may be configured to perform one or more filtering operations. The digital loop filter 104 is coupled with the phase detector 102 and the switching circuit 106, and configured to receive the error signal ES, and generate and provide a filtered signal FS to the switching circuit 106. To generate the filtered signal FS, the digital loop filter 104 is configured to filter the error signal ES. In one example, the filtered signal FS is an N-bit digital signal.

The switching circuit 106 includes suitable circuitry that may be configured to perform one or more switching operations. The switching circuit 106 is coupled with the digital loop filter 104 and the calibration system 108, and configured to receive the filtered signal FS and an enable signal EN, and provide the filtered signal FS to the calibration system 108 based on the enable signal EN. The switching circuit 106 provides the filtered signal FS to the calibration system 108 when the enable signal EN is activated. The switching circuit 106 does not provide the filtered signal FS to the calibration system 108 when the enable signal EN is deactivated, i.e., the switching circuit 106 switches from an active state to an inactive state when the enable signal EN is deactivated.

The calibration system 108 is coupled with the switching circuit 106, and configured to receive the filtered signal FS and provide the enable signal EN to the switching circuit 106. Further, the calibration system 108 is configured to calibrate the DPLL 100, generate a feedback signal FB, and output the feedback signal FB as the output signal OS. The calibration system 108 includes a calibration circuit 112 and a digitally controlled oscillator (DCO) 114.

The calibration circuit 112 includes suitable circuitry that may be configured to perform one or more calibrating operations. The calibration circuit 112 is configured to receive the input signal IS and the feedback signal FB, and generate a digital signal DS based on a frequency of the input signal IS, a frequency of the feedback signal FB, and an input bias code IBC. The input bias code IBC is one of a plurality of bias codes stored in the calibration circuit 112. Each bias code of the plurality of bias codes is indicative of a corresponding gain value of a plurality of gain values of the DCO 114. To generate the digital signal DS, the calibration circuit 112 is configured to execute a frequency calibration operation. When the calibration circuit 112 initiates the frequency calibration operation, the digital signal DS is generated based on the frequency of the input signal IS, the frequency of the feedback signal FB, and a first bias code of the plurality of bias codes as the input bias code IBC. In one example, the first bias code corresponds to a lowest bias code of the plurality of bias codes (i.e., '1').

The calibration circuit 112 is further configured to generate the enable signal EN when the digital signal DS is within an acceptable range associated with the DPLL 100. The acceptable range is a frequency range within which the DPLL 100 is configured to acquire a phase lock between the input signal IS and the output signal OS. The acceptable range associated with the DPLL 100 is based on a number of bits in the digital signal DS, a frequency modulation technique associated with the DPLL 100, and process, voltage, and temperature variations associated with the DPLL 100. If the digital signal DS exceeds the acceptable range when the input bias code IBC is the first bias code, the calibration circuit 112 is further configured to generate the digital signal DS based on the frequency of the input signal IS, the frequency of the feedback signal FB, and a second bias code of the plurality of bias codes. In one embodiment, if the digital signal DS exceeds the acceptable range when the input bias code IBC is the first bias code, the calibration circuit 112 is further configured to generate the digital signal DS within the acceptable range based on the frequency of the input signal IS, the frequency of the feedback signal FB, and the second bias code of the plurality of bias codes. In one example, the second bias code (i.e., '2') is greater than the first bias code (i.e., '1'). In other words, when the digital signal DS exceed the acceptable range, the calibration circuit 112 increments the input bias code IBC and again generates the digital signal DS. The calibration circuit 112 is further configured to repeat the aforementioned process until the digital signal DS is within the acceptable range or the input bias code IBC is equal to a predefined threshold. In one example, the predefined threshold is '5'.

The calibration circuit 112 generates the enable signal EN when the digital signal DS exceeds the acceptable range and the input bias code IBC is equal to the predefined threshold. The calibration circuit 112 is further coupled with the switching circuit 106, and further configured to provide the enable signal EN to the switching circuit 106. Thus, the enable signal EN is provided to the switching circuit 106 when the digital signal DS is within the acceptable range or the input bias code IBC is equal to the predefined threshold. Based on the enable signal EN, the DPLL 100 is configured to acquire a phase lock between the input signal IS and the feedback signal FB (i.e., the output signal OS) as the digital signal DS is within the acceptable range.

The DCO 114 is coupled with the calibration circuit 112, the switching circuit 106, and the divider circuit 110. The DCO 114 is configured to receive the input bias code IBC, the digital signal DS, and the filtered signal FS, and generate the feedback signal FB. When the enable signal EN is deactivated and the calibration circuit 112 is executing the frequency calibration operation, the DCO 114 generates the feedback signal FB based on the input bias code IBC and the digital signal DS, and provides the feedback signal FB to the calibration circuit 112. When the enable signal EN is activated and the DPLL 100 is acquiring the phase lock, the DCO 114 generates the feedback signal FB based on the input bias code IBC and the filtered signal FS, and provides the feedback signal FB as the output signal OS to the divider circuit 110. The DCO 114 is further configured to output the feedback signal FB as the output signal OS.

The divider circuit 110 includes suitable circuitry that may be configured to perform one or more dividing operations. The divider circuit 110 is coupled with the DCO 114 and the phase detector 102. The divider circuit 110 is configured to receive the output signal OS, and generate and provide the divider output signal DOS. The divider circuit 110 is configured to divide the frequency of the output signal OS to generate the divider output signal DOS.

Figure 2:
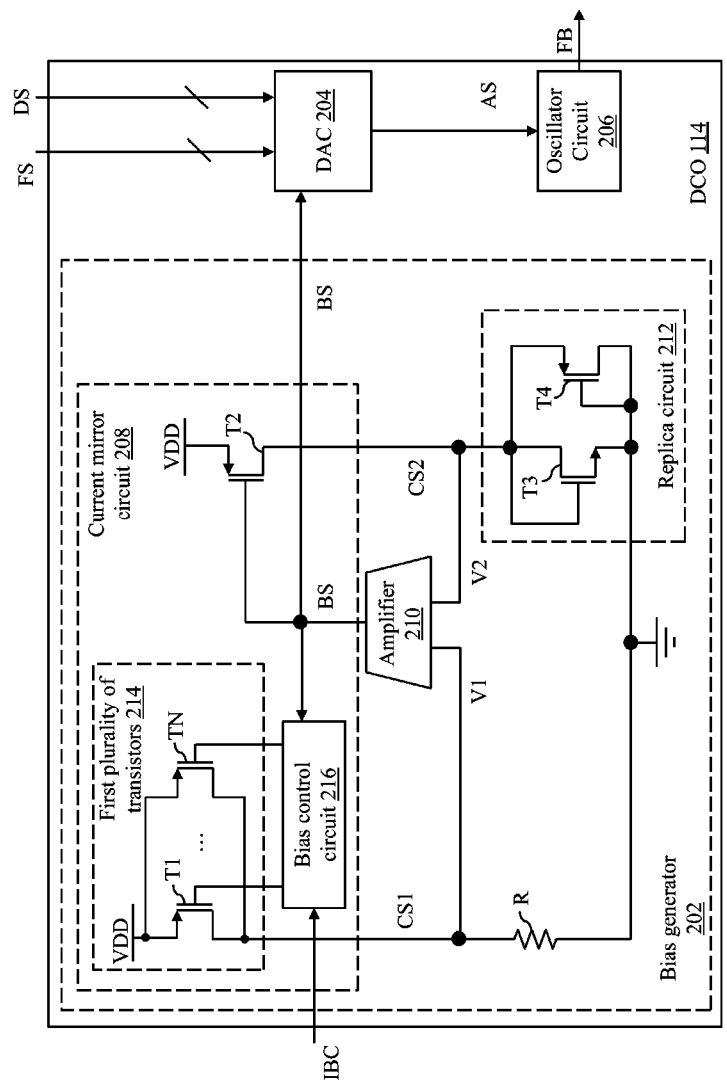
FIG. 2 is a schematic block diagram of a digitally controlled oscillator (DCO) of the DPLL of FIG. 1 in accordance with an embodiment of the present disclosure.

FIG. 2 is a schematic block diagram of the DCO 114 in accordance with an embodiment of the present disclosure. The DCO 114 includes a bias generator 202, a digital-to-analog converter (DAC) 204, and an oscillator circuit 206.

The bias generator 202 is coupled with the calibration circuit 112 and the DAC 204, and configured to receive the input bias code IBC, and generate and provide a bias signal BS to the DAC 204. The bias generator 202 includes a current mirror circuit 208, an amplifier 210, a replica circuit 212, and a resistor R.

The current mirror circuit 208 is coupled with the calibration circuit 112, and configured to receive a supply voltage signal VDD, the bias signal BS, and the input bias code IBC, and generate first and second control signals CS1 and CS2. A first current I1 associated with the first control signal CS1 is based on the input bias code IBC. A second current I2 associated with the second control signal CS2 is based on the first current I1 and a current mirror ratio associated with the current mirror circuit 208. The current mirror ratio is a ratio between the first and second currents I1 and I2. The current mirror circuit 208 includes a first plurality of transistors 214 of which first and Nth transistors T1 and TN are shown, a bias control circuit 216, and a second transistor T2. The first plurality of transistors 214 are coupled in parallel.

The first plurality of transistors 214 are coupled with the amplifier 210 by way of the bias control circuit 216, and configured to receive the supply voltage signal VDD and the bias signal BS, and generate the first control signal CS1. Each transistor of the first plurality of transistors 214 has a source terminal that is configured to receive the supply voltage signal VDD, and a gate terminal that is coupled with the bias control circuit 216, and configured to receive the bias signal BS. Each transistor of the first plurality of transistors 214 further has a drain terminal that is coupled with the resistor R.

The bias control circuit 216 is coupled with the calibration circuit 112, the amplifier 210, and the first plurality of transistors 214, and configured to receive the input bias code IBC and the bias signal BS, and provide the bias signal BS to a first set of transistors of the first plurality of transistors 214 based on the input bias code IBC. The first current I1 associated with the first control signal CS1 is directly proportional to a number of transistors in the first set of transistors, and the current mirror ratio is based on the number of transistors in the first set of transistors.

The resistor R is coupled between the current mirror circuit 208 and a ground terminal, and configured to receive the first control signal CS1. A first voltage signal V1 corresponds to a voltage drop across the resistor R that is based on the first control signal CS1. The amplifier 210 is coupled with the resistor R and the replica circuit 212, and configured to receive the first voltage signal V1 and a second voltage signal V2, and generate the bias signal BS. To generate the bias signal BS, the amplifier 210 is further configured to amplify a difference between the first and second voltage signals V1 and V2. The replica circuit 212 is coupled between the current mirror circuit 208 and the ground terminal, and configured to receive the second control signal CS2 and output the second voltage signal V2. The replica circuit 212 includes a third transistor T3 and a fourth transistor T4.

The third transistor T3 has a source terminal that is coupled with the ground terminal, a gate terminal that is configured to receive the second control signal CS2, and drain terminal that is configured to generate and output the second voltage signal V2. The fourth transistor T4 has a source terminal that is coupled with the drain terminal of the third transistor T3, and configured to receive the second voltage signal V2. The fourth transistor T4 further has gate and drain terminals that are coupled with the ground terminal. In one example, the third transistor T3 is an n-channel metal oxide semiconductor (NMOS) transistor, and the fourth transistor T4 is a p-channel metal oxide semiconductor (PMOS) transistor.

The second transistor T2 is coupled with the amplifier 210, and configured to receive the supply voltage signal VDD and the bias signal BS, and generate the second control signal CS2. In one example, each transistor of the first plurality of transistors 214 and the second transistor T2 are PMOS transistors.

The DAC 204 is coupled with the calibration circuit 112 and the bias generator 202, and configured to receive the digital signal DS and the bias signal BS. The DAC 204 is further configured to convert the digital signal DS to generate an analog signal AS based on the bias signal BS. An amplitude of the bias signal BS is based on the input bias code IBC, and a gain of the DAC 204 is directly proportional to the amplitude of the bias signal BS and corresponds to the gain of the DCO 114. Thus, the gain of the DCO 114 is determined based on the input bias code IBC. The dynamic range of the DPLL 100 is directly proportional to the gain of the DCO 114. When the enable signal EN is activated, the DAC 204 receives the filtered signal FS and generate the analog signal AS based on the filtered signal FS and the bias signal BS.

The oscillator circuit 206 is coupled with the DAC 204 and the calibration circuit 112, and configured to receive the analog signal AS, and generate the feedback signal FB, and provide the feedback signal FB to the calibration circuit 112. The frequency of the feedback signal FB is based on an amplitude of the analog signal AS. When the enable signal EN is activated, the oscillator circuit 206 outputs the feedback signal FB as the output signal OS. The oscillator circuit 206 is implemented by way of a ring oscillator that includes an array of inverters (not shown).

The third and fourth transistors T3 and T4 of the replica circuit 212 correspond to an inverter and act as a replica of the oscillator circuit 206. The replica circuit 212 thus generates the second voltage signal V2 that is directly proportional to the analog signal AS. Thus, due to variations in temperature associated with the DPLL 100, variations in the second voltage signal V2 and the analog signal AS are similar.

Figure 3A:
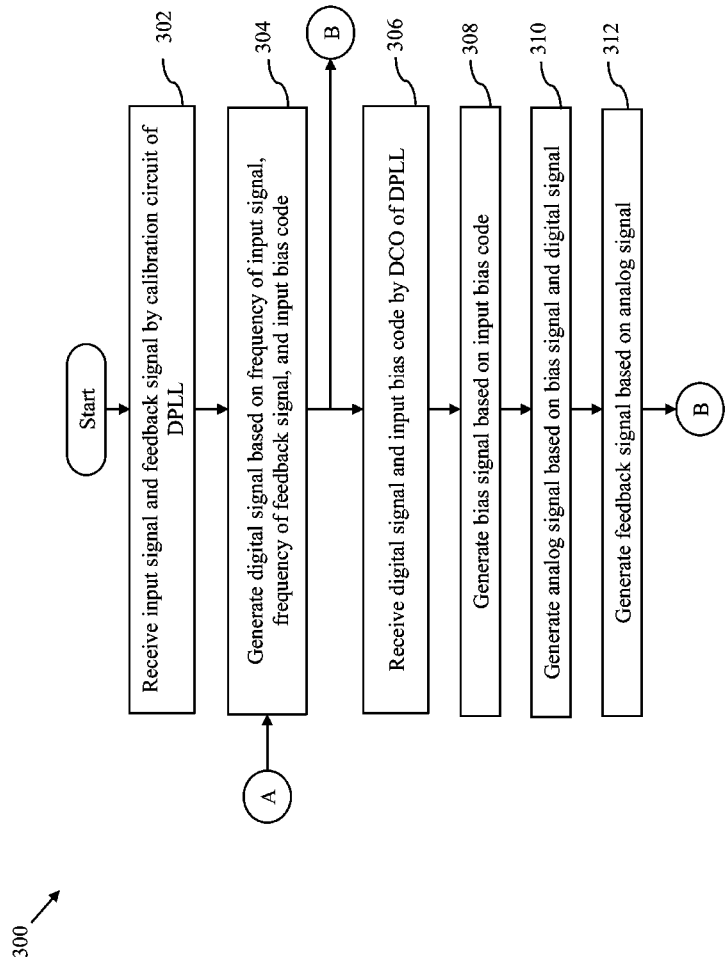
FIGS. 3A and 3B, collectively, represent a flow chart that illustrates a frequency calibration method executed by a calibration system of the DPLL of FIG. 1 in accordance with an embodiment of the present disclosure.
Figure 3B:
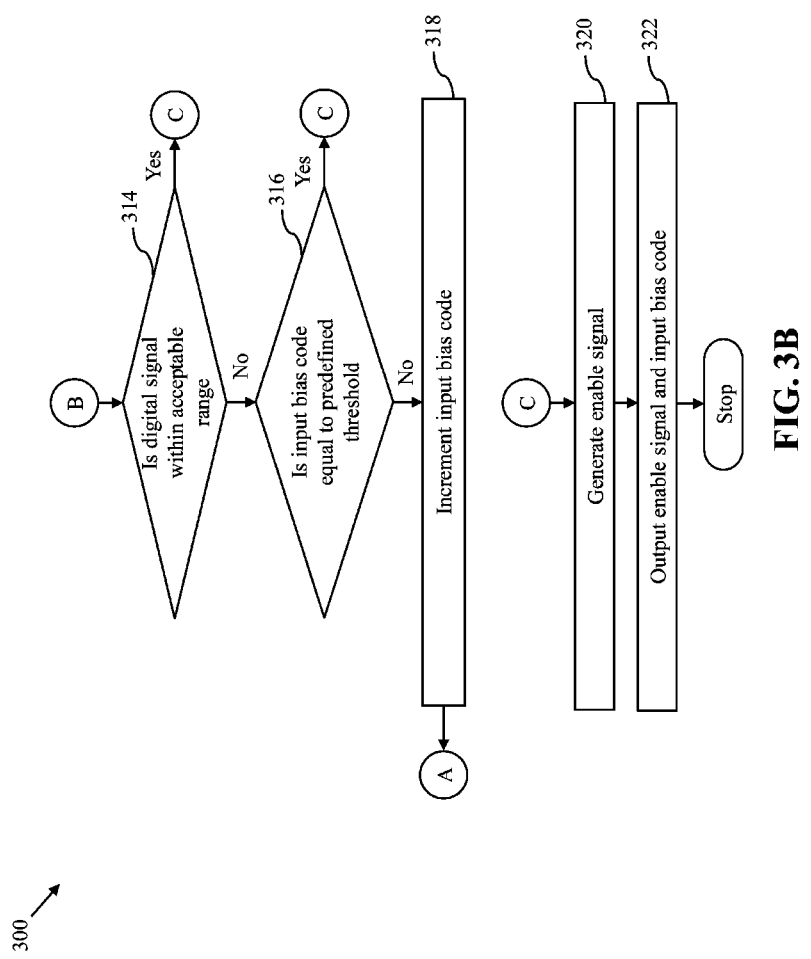

FIGS. 3A and 3B, collectively, represent a flow chart 300 that illustrates a frequency calibration method executed by the calibration system 108 in accordance with an embodiment of the present disclosure.

At step 302, the calibration circuit 112 receives the input signal IS and the feedback signal FB. At step 304, the calibration circuit 112 generates the digital signal DS based on the frequency of the input signal IS, the frequency of the feedback signal FB, and the input bias code IBC. After step 304, steps 306 and 314 are executed parallelly.

At step 306, the DCO 114 receives the digital signal DS and the input bias code IBC. At step 308, the DCO 114 generates the bias signal BS based on the input bias code IBC. At step 310, the DCO 114 generates the analog signal AS based on the bias signal BS and the digital signal DS. At step 312, the DCO 114, generates the feedback signal FB based on the analog signal AS.

At step 314, the calibration circuit 112 determines whether the digital signal DS is within the acceptable range. If at step 314, the calibration circuit 112 determines that the digital signal DS is within the acceptable range, step 320 is executed. If at step 314, the calibration circuit 112 determines that the digital signal DS is not within the acceptable range (i.e., exceeds the acceptable range), step 316 is executed.

At step 316, the calibration circuit 112 determines whether the input bias code IBC is equal to the predefined threshold. If at step 316, the calibration circuit 112 determines that the input bias code IBC is equal to the predefined threshold, step 320 is executed. If at step 316, the calibration circuit 112 determines that the input bias code IBC is not equal to the predefined threshold, step 318 is executed. At step 318, the calibration circuit 112 increments the input bias code IBC.

At step 320, the calibration circuit 112 generates the enable signal EN. At step 322, the calibration circuit 112 outputs the enable signal EN and the input bias code IBC.

The feedback signal FB (i.e., the output signal OS) is thus generated based on the bias signal BS and the digital signal DS during the calibration of the DPLL 100. As the bias signal BS is generated based on the input bias code IBC and the bias signal BS and the digital signal DS determine a dynamic range, i.e., a desired frequency range of operation, of the DPLL 100, the calibration circuit 112 is capable of varying the dynamic range of the DPLL 100 by varying the input bias code IBC. Thus, when the desired frequency range of the DPLL 100 is high, the calibration circuit 112 increases the dynamic range of the DPLL 100 by varing the input bias code IBC. As a result, a need to increase a number of bits in the digital signal DS to increase the dynamic range of the DPLL 100 is eliminated, thereby reducing a size of the DCO 114 as compared to a DCO of a conventional calibration system of a conventional DPLL. Further, frequency variations due to variations in process, voltage, and temperature (PVT) and frequency modulation techniques associated with the DPLL 100 do not affect an ability of the DPLL 100 to acquire the phase lock between the input signal IS and the output signal OS. Additionally, the DCO 114 generates the bias signal BS internally based on the replica circuit 212 due to which the DPLL 100 is capable of tracking the variations in PVT associated with the DPLL 100.

While various embodiments of the present disclosure have been illustrated and described, it will be clear that the present disclosure is not limited to these embodiments only. Numerous modifications, changes, variations, substitutions, and equivalents, without departing from the spirit and scope of the present disclosure, as described in the claims.

The invention claimed is:

1. A calibration system of a digital phase locked loop (DPLL), the calibration system comprising:
   a calibration circuit that is configured to:
      receive an input signal and a feedback signal; and
      generate a digital signal, based on a frequency of the input signal, a frequency of the feedback signal, and an input bias code; and
   a digitally controlled oscillator (DCO) that is coupled with the calibration circuit, and configured to:
      receive the input bias code and the digital signal;
      generate a bias signal based on the input bias code;
      generate an analog signal based on the bias signal and the digital signal; and
      generate the feedback signal based on the analog signal, wherein the frequency of the feedback signal is based on an amplitude of the analog signal.

2. The calibration system of claim 1, wherein the calibration circuit is further configured to generate an enable signal when the digital signal is within an acceptable range associated with the DPLL, wherein the acceptable range is a frequency range within which the DPLL is configured to acquire a phase lock between the input signal and the feedback signal, and wherein based on the enable signal, the DPLL is configured to acquire a phase lock between the input and feedback signals.

3. The calibration system of claim 2, wherein the calibration circuit is further configured to generate the enable signal when the digital signal exceeds the acceptable range and the input bias code is equal to a predefined threshold.

4. The calibration system of claim 2, wherein when the digital signal exceeds the acceptable range, the calibration circuit is further configured to generate the digital signal within the acceptable range based on the frequency of the input signal, the frequency of the feedback signal, and a first bias code of a plurality of bias codes as the input bias code, and wherein the digital signal exceeds the acceptable range when the input bias code is a second bias code of the plurality of bias codes.

5. The calibration system of claim 2, wherein the acceptable range associated with the DPLL is based on a number of bits in the digital signal, a frequency modulation technique associated with the DPLL, and process, voltage, and temperature variations associated with the DPLL.

6. The calibration system of claim 1, wherein the DCO comprises:
   a bias generator that is coupled with the calibration circuit, and configured to receive the input bias code and generate the bias signal;
   a digital-to-analog converter (DAC) that is coupled with the calibration circuit and the bias generator, and configured to receive the digital signal and the bias signal, and convert, based on the bias signal, the digital signal to generate the analog signal; and
   an oscillator circuit that is coupled with the DAC and the calibration circuit, and configured to receive the analog signal, generate the feedback signal, and provide the feedback signal to the calibration circuit.

7. The calibration system of claim 6, wherein the bias generator comprises:
   a current mirror circuit that is coupled with the calibration circuit, and configured to receive a supply voltage signal, the bias signal, and the input bias code, and generate first and second control signals, wherein a first current associated with the first control signal is based on the input bias code, and wherein a second current associated with the second control signal is based on the first current and a current mirror ratio associated with the current mirror circuit;
   a resistor that is coupled between the current mirror circuit and a ground terminal, and configured to receive the first control signal, wherein a first voltage signal corresponds to a voltage drop across the resistor;
   a replica circuit that is coupled between the current mirror circuit and the ground terminal, and configured to receive the second control signal and output a second voltage signal, wherein the second voltage signal is directly proportional to the analog signal; and
   an amplifier that is coupled with the resistor and the replica circuit, and configured to receive the first and second voltage signals and generate the bias signal.

8. The calibration system of claim 7, wherein the current mirror circuit comprises:
   a first plurality of transistors that are coupled in parallel, wherein the first plurality of transistors are configured to receive the supply voltage signal and the bias signal, and generate the first control signal;
   a bias control circuit that is coupled between the amplifier and the first plurality of transistors, and configured to receive the bias signal, wherein the bias control circuit is further coupled with the calibration circuit, and configured to receive the input bias code and provide the bias signal to a first set of transistors of the first plurality of transistors based on the input bias code; and
   a second transistor that is coupled with the amplifier, and configured to receive the supply voltage signal, the bias signal, and generate the second control signal.

9. The calibration system of claim 8, wherein the first current associated with the first control signal is directly proportional to a number of transistors in the first set of transistors, and wherein the current mirror ratio is based on the number of transistors in the first set of transistors.

10. The calibration system of claim 7, wherein the replica circuit comprises:
a third transistor, wherein the third transistor has (i) a source terminal that is coupled with the ground terminal, (ii) a gate terminal that is configured to receive the second control signal, and (iii) a drain terminal that is configured to generate and output the second voltage signal; and
a fourth transistor, wherein the fourth transistor has (i) a source terminal that is coupled with the drain terminal of the third transistor, and configured to receive the second voltage signal, (ii) a gate terminal that is coupled with the ground terminal, and (iii) a drain terminal that is coupled with the ground terminal.

11. A digitally controlled oscillator (DCO), comprising:
a bias generator that is configured to receive an input bias code and generate a bias signal;
a digital-to-analog converter (DAC) that is coupled with the bias generator, and configured to receive a digital signal and the bias signal, and convert, based on the bias signal, the digital signal to generate an analog signal; and
an oscillator circuit that is coupled with the DAC, and configured to receive the analog signal and generate an output signal, wherein a frequency of the output signal is based on an amplitude of the analog signal.

12. The DCO of claim 11, wherein the bias generator comprises:
a current mirror circuit that is configured to receive a supply voltage signal, the bias signal, and the input bias code, and generate first and second control signals, wherein a first current associated with the first control signal is based on the input bias code, and wherein a second current associated with the second control signal is based on the first current and a current mirror ratio associated with the current mirror circuit;
a resistor that is coupled between the current mirror circuit and a ground terminal, and configured to receive the first control signal, wherein a first voltage signal corresponds to a voltage drop across the resistor;
a replica circuit that is coupled between the current mirror circuit and the ground terminal, and configured to receive the second control signal and generate a second voltage signal, wherein the second voltage signal is directly proportional to the analog signal; and
an amplifier that is coupled with the resistor and the replica circuit, and configured to receive the first and second voltage signals and generate the bias signal.

13. The DCO of claim 12, wherein the current mirror circuit comprises:
a first plurality of transistors that are coupled in parallel, wherein the first plurality of transistors is configured to receive the supply voltage signal and the bias signal, and generate the first control signal;
a bias control circuit that is coupled between the amplifier and the first plurality of transistors, and configured to receive the bias signal, wherein the bias control circuit is further configured to receive the input bias code and provide the bias signal to a first set of transistors of the first plurality of transistors based on the input bias code; and a second transistor that is coupled with the amplifier, and configured to receive the supply voltage signal, the bias signal, and generate the second control signal.

14. The DCO of claim 13, wherein the first current associated with the first control signal is directly proportional to a number of transistors in the first set of transistors, and wherein the current mirror ratio is based on the number of transistors in the first set of transistors.

15. The DCO of claim 12, wherein the replica circuit comprises:
a third transistor, wherein the third transistor has (i) a source terminal that is coupled with the ground terminal, (ii) a gate terminal that is configured to receive the second control signal, and (iii) a drain terminal that is configured to generate the second voltage signal; and
a fourth transistor, wherein the fourth transistor has (i) a source terminal that is coupled with the drain terminal of the third transistor, and configured to receive the second voltage signal, (ii) a gate terminal that is coupled with the ground terminal, and (iii) a drain terminal that is coupled with the ground terminal.

16. A method of calibrating a digital phase locked loop (DPLL), the method comprising:
receiving, by a calibration circuit of the DPLL, an input signal and a feedback signal;
generating, by the calibration circuit, a digital signal based on a frequency of the input signal, a frequency of the feedback signal, and an input bias code;
receiving, by a digitally controlled oscillator (DCO) of the DPLL, the input bias code and the digital signal;
generating, by the DCO, a bias signal based on the input bias code;
generating, by the DCO, an analog signal based on the bias signal and the digital signal; and
generating, by the DCO, the feedback signal based on the analog signal, wherein the frequency of the feedback signal is based on an amplitude of the analog signal.

17. The method of claim 16, further comprising:
generating, by the calibration circuit, an enable signal when the digital signal is within an acceptable range associated with the DPLL, wherein the acceptable range is a frequency range within which a phase lock is acquired between the input signal and the feedback signal, wherein based on the enable signal, a phase lock is acquired between the input and feedback signals.

18. The method of claim 17, further comprising:
generating, by the calibration circuit, the enable signal when the digital signal exceeds the acceptable range and the input bias code is equal to a predefined threshold.

19. The method of claim 17, further comprising:
generating, by the calibration circuit, the digital signal within the acceptable range based on the frequency of the input signal, the frequency of the feedback signal, and a first bias code of a plurality of bias codes as the input bias code when the digital signal exceeds the acceptable range, wherein the digital signal exceeds the acceptable range when the input bias code is a second bias code of the plurality of bias codes.

20. The method of claim 17, wherein the acceptable range associated with the DPLL is based on a number of bits in the digital signal, a frequency modulation technique associated with the DPLL, and process, voltage, and temperature variations associated with the DPLL.

* * * * *